(12) United States Patent
Lee

(10) Patent No.: US 6,580,656 B2
(45) Date of Patent: Jun. 17, 2003

(54) SEMICONDUCTOR MEMORY DEVICE HAVING MEMORY CELL BLOCK ACTIVATION CONTROL CIRCUIT AND METHOD FOR CONTROLLING ACTIVATION OF MEMORY CELL BLOCKS THEREOF

(75) Inventor: Woo Young Lee, Kyoungki-do (KR)

(73) Assignee: Hynix Semiconductor Inc., Ichon-shi (KR)

( * ) Notice: Subject to any disclaimer, the term of this patent is extended or adjusted under 35 U.S.C. 154(b) by 0 days.

(21) Appl. No.: 10/029,215

(22) Filed: Dec. 28, 2001

(65) Prior Publication Data

US 2002/0095544 A1 Jul. 18, 2002

(30) Foreign Application Priority Data

Dec. 29, 2000 (KR) .......................................... 2000-86308

(51) Int. Cl.[7] .............................. G11C 8/00; G11C 7/00
(52) U.S. Cl. ............. 365/230.03; 365/203; 365/189.07; 365/233; 365/194
(58) Field of Search .......................... 365/230.03, 203, 365/189.07, 233, 194

(56) References Cited

U.S. PATENT DOCUMENTS

| | | | | |
|---|---|---|---|---|
| 5,835,436 A | * | 11/1998 | Ooishi | 365/222 |
| 6,052,331 A | * | 4/2000 | Araki et al. | 365/230.03 |
| 6,094,398 A | * | 7/2000 | Rieger | 365/230.01 |
| 6,154,414 A | * | 11/2000 | Lee | 365/189.07 |
| 6,344,990 B1 | * | 2/2002 | Matsumiya et al. | 365/149 |
| 6,349,072 B1 | * | 2/2002 | Origasa et al. | 365/189.05 |
| 6,377,506 B2 | * | 4/2002 | Kitazawa | 365/230.03 |
| 6,381,191 B2 | * | 4/2002 | Ooishi | 365/189.05 |

* cited by examiner

Primary Examiner—David Nelms
Assistant Examiner—Ly Duy Pham
(74) Attorney, Agent, or Firm—Jacobson Holman PLLC

(57) ABSTRACT

A semiconductor memory device having a plurality of memory cell blocks employs a block activation control unit for controlling an activation timing of the plurality of memory cell blocks. Therefore, when a previously inputted block activation signal is identical to a currently inputted block activation signal, the currently inputted block activation signal is delayed for a predetermined time, so that the memory cell block can be activated after a precharge operation. When the previously inputted block activation signal is different from the currently inputted block activation signal, the memory cell block corresponding to the currently inputted block activation signal is activated, and the memory cell block corresponding to the previously inputted block activation signal performs the precharge operation at the same time. As a result, unnecessary delay time is reduced in memory block activation, thereby improving operation speed.

11 Claims, 4 Drawing Sheets

SEMICONDUCTOR MEMORY DEVICE HAVING MEMORY CELL BLOCK ACTIVATION CONTROL CIRCUIT AND METHOD FOR CONTROLLING ACTIVATION OF MEMORY CELL BLOCKS THEREOF

BACKGROUND OF THE INVENTION

1. Field of the Invention

The present invention relates to a semiconductor memory device having a plurality of memory cell blocks controlled by a memory cell block activation control circuit, and a method for controlling activation of memory cell blocks which can improve operation speed, by controlling activation timing of the plurality of memory cell blocks and reducing unnecessary delay time in the memory block activation.

2. Description of the Background Art

A data read/write operation of a general semiconductor memory device having a plurality of memory cell blocks will be explained.

In the read operation, one memory cell block is selected from the plurality of memory cell blocks according to a block select address. The selected memory cell block is activated.

In the activated memory cell block, when a row address strobe signal /RAS is activated in a low level and a row address is transmitted at the same time, one word line corresponding to the row address is activated, and thus data stored in a plurality of cells connected to the activated word line are transmitted to bit lines. A minute electrical signal of each bit line is sensed and amplified by a sense amp.

The data amplified by the sense amp on the bit line corresponding to a column address is externally outputted in response to activation of a column address strobe signal /CAS. Here, the block select address is generated, by using the most significant address among the row addresses.

After the data stored in the selected cell is outputted, in accordance with the row address and the column address, the enabled word line is precharged, and returns to an inactivation state. A predetermined time tRP may be set up in design between the start of a precharge state and the end of the precharge state.

For example, when the memory cell block indicated by the block select address is activated, and the word line corresponding to the row address is activated, no operation can be performed for the time tRP necessary for precharging the activated word line, which results in time consumption. That is, although one word line is activated and the read or write operation is performed and ended, another word line is not activated during tRP necessary to precharge the activated word line. During the unnecessarily repeated precharge operation, the DRAM maintains a stand-by mode. Accordingly, it is impossible to achieve high-speed operation.

The precharge time tRP is determined by specification in designing the semiconductor memory device. Although the memory cell block does not need to be precharged, the memory cell block is activated after the standby time for as long as the precharge time tRP, thereby unnecessarily increasing the operation delay time.

SUMMARY OF THE INVENTION

Accordingly, it is an object of the present invention to achieve a high-speed operation by reducing a delay time in activation of a memory cell block.

In order to achieve the above-described object of the invention, there is provided a semiconductor memory device having a memory cell block activation control circuit, including: a block activation signal generating means for generating a block activation signal which activates a plurality of memory cell blocks by using a row active signal and a row address; and a block activation control means for outputting a block activation control signal which controls activation timing of the plurality of memory cell blocks by using the block activation signal and the row active signal.

There is also provided a method for controlling activation of memory cell blocks of a semiconductor memory device, including the steps of: checking whether a currently activated memory cell block is identical to a previously activated memory cell block; activating the current memory cell block after a predetermined delay time, when the currently activated memory cell block is identical to the previously activated memory cell block; and activating the current memory cell block without delay, when the currently activated memory cell block is different from the previously activated memory cell block.

BRIEF DESCRIPTION OF THE DRAWINGS

The present invention will become better understood with reference to the accompanying drawings which are given only by way of illustration and thus are not limitative of the present invention, wherein.

DETAILED DESCRIPTION OF THE PREFERRED EMBODIMENTS

A semiconductor memory device having a memory cell block activation control circuit, and a method for controlling activation of memory cell blocks thereof in accordance with a preferred embodiment of the present invention will be described in detail with reference to the accompanying drawings.

Figure 1:
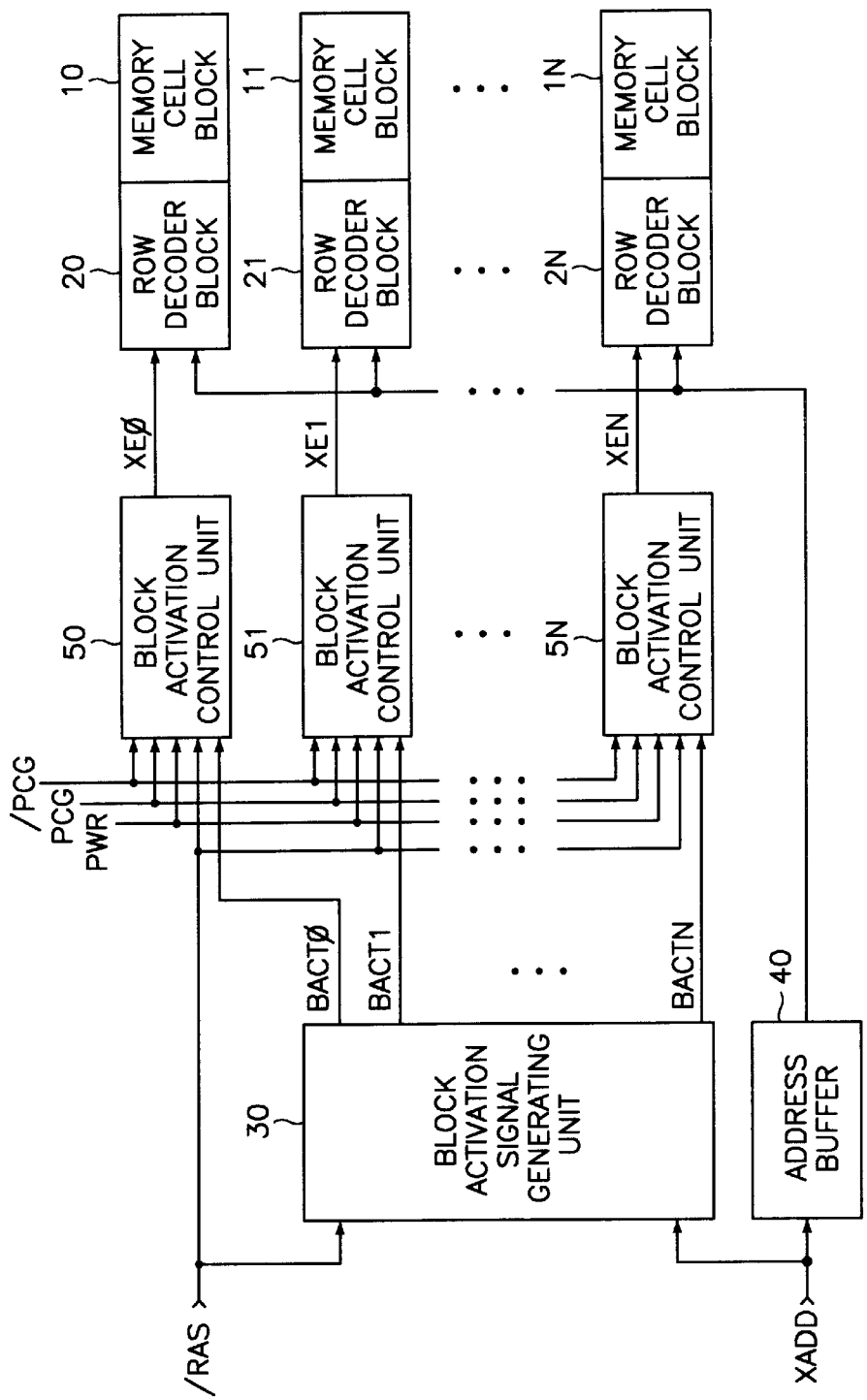
FIG. 1 is a block diagram illustrating a semiconductor memory device using a block activation control unit in accordance with the present invention.

FIG. 1 is a block diagram illustrating the semiconductor memory device having the memory cell block activation control circuit in accordance with the present invention.

Referring to FIG. 1, the semiconductor memory device includes: a plurality of memory cell blocks 10-1N each having a plurality of memory cell arrays that are each composed of a plurality of memory cells; a plurality of row decoder blocks 20-2N each for decoding row addresses to activate word lines of a corresponding one of the memory cell blocks 10-1N; a block activation signal generating unit 30 for outputting activation commands BACT0-BACTN which activate the selected memory cell block 1$i$ according to a row address strobe signal /RAS and row address XADD; an address buffer 40 for receiving the row address XADD and transmitting the row address XADD to the row decoder blocks 20-2N; and a plurality of block activation control units 50-5N for outputting row decoder block control signals XE0-XEN to the corresponding row decoder block 2$i$ for controlling activation and precharge timing of the memory cell block 2$i$ according to the row address strobe signal /RAS and the activation commands BACT0-BACTN.

Here, the block activation control unit 50 stores the previous block activation command BACT0($i$-1), and compares it with the currently-inputted activation command BACT0$i$. When the two commands are identical, the block activation control unit 50 performs a general precharge operation. When the two commands are different, the block activation control unit 50 outputs the row decoder block control signals XE0. As a result, the memory cell block 10($i$-1) corresponding to the previous block activation command BACT0($i$-1) can perform the precharge operation, and the memory cell block 10$i$ corresponding to the current activation command BACT0$i$ can perform the read or write operation at the same time.

Figure 2:
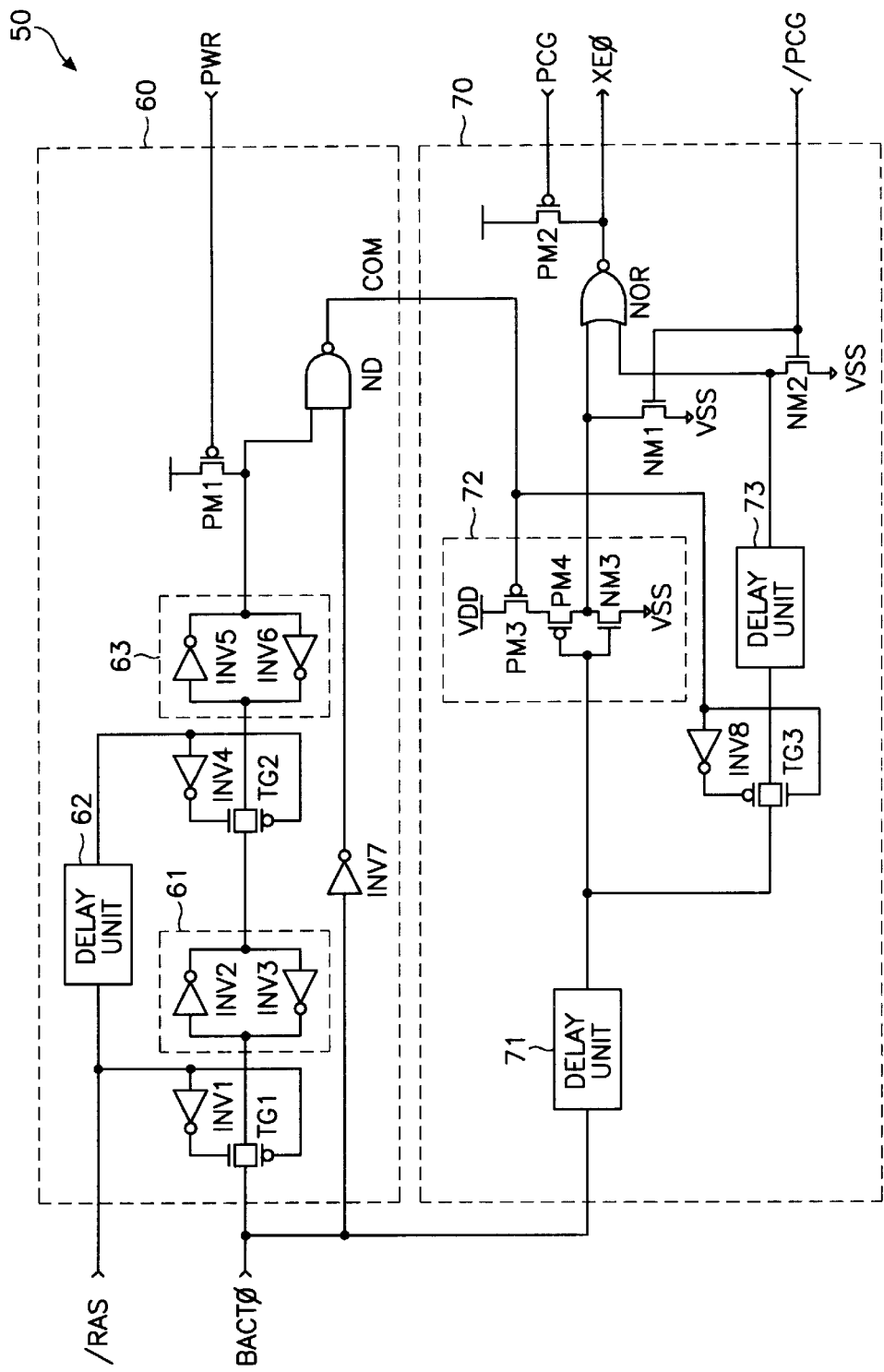
FIG. 2 is a detailed-circuit diagram illustrating the block activation control unit of the semiconductor memory device of FIG. 1.

FIG. 2 is a detailed-circuit diagram illustrating the block activation control unit 50.

As illustrated in FIG. 2, the block activation control unit 50 includes: a comparing unit 60 for comparing the current activation command BACT0$i$ with the previous activation command BACT0($i$-1) and outputting a comparison result COM; and a row decoder control signal generating unit 70 for controlling activation of the corresponding row decoder block 20 according to the comparison result COM of the comparing unit 60.

The comparing unit 60 includes: a transmission gate TG1 for selectively transmitting the currently inputted activation command BACT0$i$ according to the row address strobe signal /RAS and a inverted signal of /RAS inverted by an inverter INV1; a latch unit 61 composed of two inverters INV2 and INV3 for inverting and latching the currently inputted activation command BACT0$i$ from the transmission gate TG1; a delay unit 62 for delaying the row address strobe signal /RAS for a predetermined time; a transmission gate TG2 for selectively transmitting the previously inputted activation command BACT0($i$-1) according to the delayed row address strobe signal /RAS and a inverted signal of the delayed row address strobe signal /RAS inverted by an inverter INV4; a latch unit 63 composed of two inverters INV5 and INV6 for inverting and latching the previously inputted activation command BACT0($i$-1) from the transmission gate TG2; a PMOS transistor PM1 for initializing the output terminal of the latch unit 63 to a high level according to a power-up signal PWR; an inverter INV7 for inverting the currently inputted activation command BACT0$i$; and a NAND gate ND for NANDing the previously inputted activation command BACT0($i$-1) from the latch unit 63 and an inverted signal of the currently inputted activation command BACT0$i$ inverted by the inverter INV7.

The row decoder control signal generating unit 70 includes: a delay unit 71 for delaying the currently inputted activation signal BACT0$i$ for a predetermined time; a driving unit 72 for driving the delayed currently inputted activation signal BACT0$i$ from the delay unit 71 according to the output signal COM from the comparing unit 60; a transmission gate TG3 for selectively transmitting the delayed currently inputted activation signal BACT0$i$ from the delay unit 71 according to the output signal COM from the comparing unit 60 and a inverted signal of COM inverted by an inverter INV8; a delay unit 73 for delaying the signal from the transmission gate TG3 for a predetermined time; a NOR gate NOR for NORing the output signal from the driving unit 72 and the output signal from the delay unit 73, and outputting the row decoder block control signal XE0; NMOS transistors NM1 and NM2 for initializing the input terminals of the NOR gate NOR to a ground voltage VSS according to an inverted precharge signal /PCG; and a PMOS transistor PM2 for initializing the output terminal of the NOR gate NOR to a high level VDD according to a precharge signal PCG.

The driving unit 72 includes: a PMOS transistor PM3 having its gate connected to receive the output signal COM from the comparing unit 60; and a PMOS transistor PM4 and an NMOS transistor NM3 being connected in series between the drain of the PMOS transistor PM3 and the ground voltage VSS, having their gates commonly connected to receive the output signal from the delay unit 71, and having their drains commonly connected to compose an output terminal.

The operation of the block activation control unit of the semiconductor memory device using the block activation control circuit will be described.

When the previously activated memory cell block is identical to the currently activated memory cell block, the identical signal is latched in the latch units 61 and 63 of the block activation control unit 50 activating the row decoder block 20 corresponding to the activated memory cell block 10.

When the signal latched in the latch unit 63 is compared with the currently inputted block activation signal BACT0$i$, the two signals are identical, and thus the comparing unit 60 outputs the high level output signal COM.

Since the output signal COM from the comparing unit 60 is at a high level, the driving unit 72 of the row decoder control signal generating unit 70 is disabled, and the delayed block activation signal BACT0$i$ by the delay unit 71 is delayed by the inverting delay unit 73 and inputted to one input terminal of the NOR gate NOR by the transmission gate TG3. Here, the other input terminal of the NOR gate NOR is set up to have a low level VSS according to the inverted precharge signal /PCG. Accordingly, the NOR gate NOR enables the row decoder block control signal XE0 after a delay time as long as the delay time of the delay unit 73. The delay time of the delay unit 73 is sufficiently long so that the memory cell block 10 can perform the precharge operation.

Therefore, in the case that the identical memory cell block is continuously activated to perform the read or write operation, the read or write operation, the precharge operation and the read or write operation are sequentially carried out.

On the other hand, when the previously activated memory cell block is different from the currently activated memory cell block, a low level signal is latched in the latch unit 63 of the block activation control unit 50 corresponding to the currently inputted block activation signal BACT0$i$, and thus the output signal COM from the comparing unit 60 has a low level.

Accordingly, the driving unit 72 of the row decoder control signal generating unit 70 is enabled to drive the delayed currently inputted block activation signal BACT0$i$ by the delay unit 71, and to transmit it to one input terminal of the NOR gate NOR. Here, the other input terminal of the NOR gate NOR is set up to have the low level VSS according to the inverted precharge signal /PCG. Accordingly, the NOR gate NOR enables the row decoder block control signal XE0. The output signal COM from the comparing unit 60 has a low level, and thus the transmission gate TG3 is turned off.

As described above, when the previously activated memory cell block is identical to the currently activated memory cell block, the block activation control units 50 enable the row decoder block control signal XE0 after the delay time as long as the precharge time of the activated memory cell block as in the general semiconductor memory device. When the previously activated memory cell block is different from the currently activated memory cell block, the block activation control units 50 enable the row decoder block control signal XE0. As a result, the previously activated memory cell block can perform the precharge operation, and the currently activated memory block can perform the read or write operation at the same time.

The operation of the semiconductor memory device using the block activation control circuit in accordance with the present invention will be described with reference to FIGS. 3 and 4.

Figure 3:
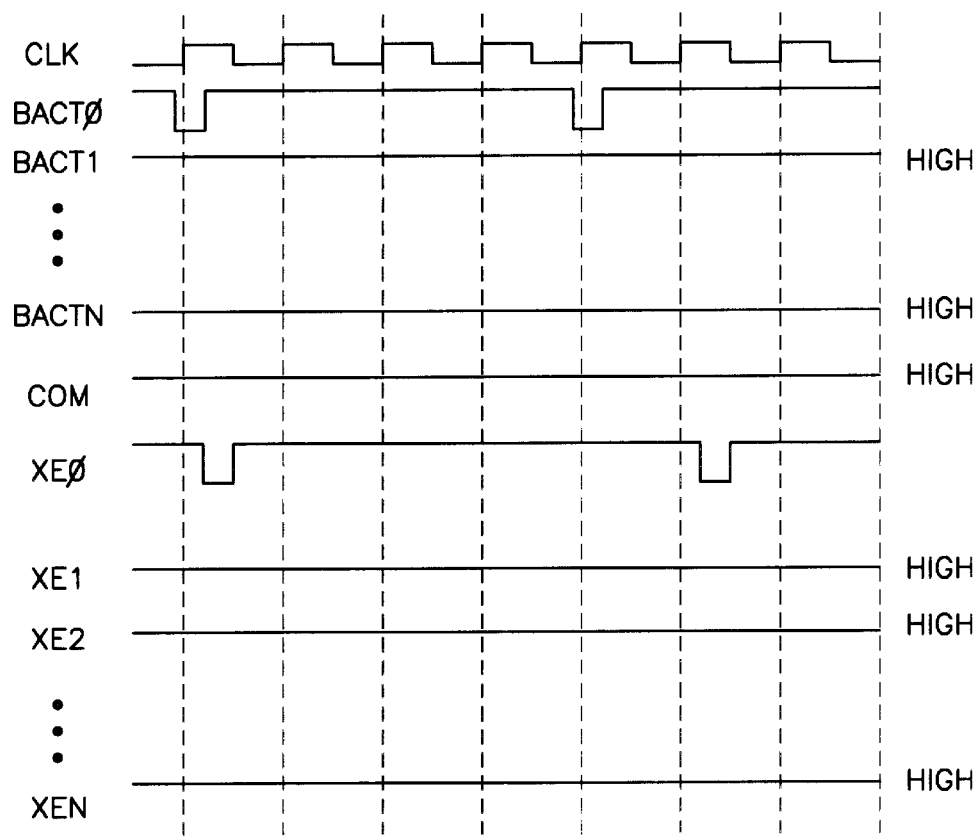
FIG. 3 is a timing diagram of a block activation operation when a previously inputted block activation signal is identical to a currently inputted block activation signal in the semiconductor memory device of FIG. 1.

FIG. 3 is a timing diagram of signals when the previously activated memory cell block 10 is identical to the currently activated memory cell block 10.

As depicted in FIG. 3, when the block activation signal BACT0 is enabled and inputted to the block activation control unit 50, the block activation control unit 50 enables the row decoder block control signal XE0 to enable the word line of the memory cell block 10 according to the row address XADD inputted to the row decoder block 20, thereby performing the read operation according to an inputted read command RD.

When the read operation is finished, the precharge operation is performed according to the precharge command PCG.

Here, when the identical block activation signal BACT0 is enabled and inputted to the block activation control unit 50, the comparing unit 60 compares the inputted signal BACT0 with the previously inputted block activation signal BACT0 latched in the latch unit 63, and outputs the high level output signal COM, thereby activating the row decoder block control signal XE0 after the delay time as long as the precharge time.

Figure 4:
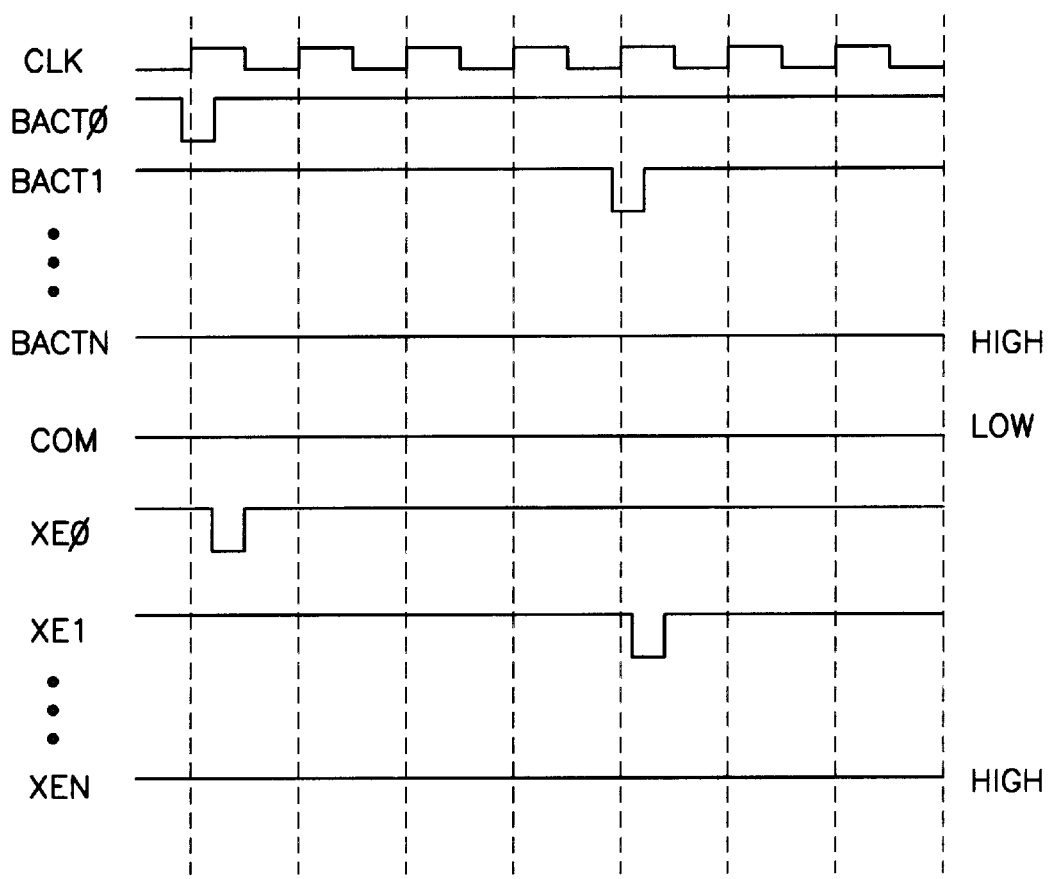
FIG. 4 is a timing diagram of the block activation operation when the previously inputted block activation signal is different from the currently inputted block activation signal in the semiconductor memory device of FIG. 1.

FIG. 4 is a timing diagram of signals when the previously activated memory cell block 10 is different from the currently activated memory cell block 11.

As shown in FIG. 4, when the block activation signal BACT0 is enabled and inputted to the block activation control unit 50, the block activation control unit 50 enables the row decoder block control signal XE0 to enable the word line of the memory cell block 10 according to the row address XADD inputted to the row decoder block 20, thereby performing the read operation according to the inputted read command RD.

When the read operation is finished, the precharge operation is performed according to the precharge command PCG.

Here, when the different block activation signal BACT1 is enabled and inputted to the block activation control unit 51, the comparing unit 60 compares the inputted signal BACT1 with the previously inputted block activation signal BACT0 latched in the latch unit 63, and outputs the low level output signal COM. As a result, the memory cell block 10 performs the precharge operation, and the memory cell block 11 is activated to perform the read operation at the same time.

Accordingly, when the previously activated memory cell block is different from the currently activated memory cell block, the previously activated memory cell block performs the precharge operation, and the currently activated memory cell block performs the read or write operation at the same time, to reduce a standby time for the succeeding operation of the memory cell blocks in the semiconductor memory device during the precharge operation.

As discussed earlier, in accordance with the present invention, when the previously activated memory cell block is different from the currently activated memory cell block, the previously activated memory cell block performs the precharge operation, and the currently activated memory cell block performs the read or write operation at the same time, thereby reducing the delay time for carrying out the precharge operation. It is thus possible to achieve a high-speed operation.

As the present invention may be embodied in several forms without departing from the spirit or essential characteristics thereof, it should also be understood that the above-described embodiment is not limited by any of the details of the foregoing description, unless otherwise specified, but rather should be construed broadly within its spirit and scope as defined in the appended claims, and therefore all changes and modifications that fall within the metes and bounds of the claims, or equivalences of such metes and bounds are therefore intended to be embraced by the appended claims.

What is claimed is:

1. A method for controlling activation of memory cell blocks of a semiconductor memory device, comprising the steps of:

activating a first memory cell block;

checking whether a second memory cell block to be activated is identical to the currently activated first memory cell block;

activating the second memory cell block after a predetermined delay time, when the second memory cell block is identical to the first activated memory cell block; and activating the second memory cell block without delay, when the second memory cell block is different from the first activated memory cell block.

2. The method according to claim 1, wherein the delay time for delaying the activation timing of the memory cell block is as long as a precharge time of the memory cell block.

3. A semiconductor memory device having a memory cell block activation control circuit, comprising:

(a). a block activation signal generating means for generating block activation signals which activate a plurality of memory cell blocks by using a row active signal and a row address; and (b). a block activation control means for outputting a block activation control signal which controls an activation timing of the plurality of memory cell blocks by using the block activation signal and the row active signal, said block activation control means including (i). a comparing means for comparing the previous block activation signal with the current block activation signal; and (ii). a block activation control signal generating means for delaying the current block activation signal for a predetermined time and outputting the block activation control signal when the two signals are identical, and for driving the current block activation signal and outputting the block activation control signal when the two signals are different.

4. The device according to claim 3, wherein the comparing means comprises:

a first storing means for storing the current block activation signal;

a second storing means for storing the previous block activation signal; and a logical means for comparing the previous block activation signal with the current block activation signal.

5. The device according to claim 4, wherein the comparing means further comprises:

a first transmission means for selectively transmitting the block activation signal stored in the first storing means according to the row active signal;

a second transmission means for selectively transmitting the block activation signal stored in the second storing means according to a delayed signal of the row active signal; and a second logical means for logically combining the signal stored in the second storing means and an inverted version of the signal of the current block activation signal.

6. The device according to claim 4, wherein the comparing means further comprises a switching means for initializing the output terminal of the second storing means to a high level in a power-down period according to a power-on signal activated in a power-on period.

7. The device according to claim 3, wherein the block activation control signal generating means comprises:

a delay means with an output terminal for delaying the block activation signal for a predetermined time according to the output signal from the comparing means;

a driving means for driving the block activation signal according to the output signal from the comparing means; and a logical means for logically combining the output signal from the delay means and the output signal from the driving means.

8. The device according to claim 7, wherein the delay means comprises:

a transmission means for selectively transmitting the block activation signal according to the output signal from the comparing means; and an inverting delay means for delaying the block activation signal selectively transmitted by the transmission means for a predetermined time.

9. The device according to claim 7, wherein the driving means inverts and drives the block activation signal according to the output signal from the comparing means.

10. The device according to claim 3, wherein the block activation control signal generating means further comprises:

a switching means for initializing the block activation control signal to a high level according to a precharge control signal activated in a precharge operation.

11. The device according to claim 7, wherein the block activation control signal generating means further comprises:

a first switching means for initializing the output terminal of the delay means to a low level according to an inverted signal of the precharge control signal activated in the precharge operation; and a second switching means for initializing the output terminal of the driving means to a low level according to an inverted signal of the precharge control signal activated in the precharge operation.

* * * * *